(12) United States Patent
Yoshimoto et al.

(10) Patent No.: US 8,991,312 B2
(45) Date of Patent: Mar. 31, 2015

(54) FLEXOGRAPHIC PRINTING ORIGINAL PLATE

(75) Inventors: Kazuya Yoshimoto, Okayama (JP); Tetsuma Kawakami, Okayama (JP); Yasuyuki Munekuni, Okayama (JP); Keiichi Motoi, Okayama (JP); Yukimi Yawata, Okayama (JP); Toru Wada, Okayama (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 618 days.

(21) Appl. No.: 12/937,482

(22) PCT Filed: Jan. 21, 2009

(86) PCT No.: PCT/JP2009/000202
§ 371 (c)(1),
(2), (4) Date: Oct. 12, 2010

(87) PCT Pub. No.: WO2009/141930
PCT Pub. Date: Nov. 26, 2009

(65) Prior Publication Data
US 2011/0023739 A1 Feb. 3, 2011

(30) Foreign Application Priority Data
May 23, 2008 (JP) .................................. 2008-135374

(51) Int. Cl.
*B41N 1/12* (2006.01)
*B41C 1/05* (2006.01)
*G03F 7/09* (2006.01)
*G03F 7/20* (2006.01)

(52) U.S. Cl.
CPC ... *B41N 1/12* (2013.01); *B41C 1/05* (2013.01); *G03F 7/092* (2013.01); *G03F 7/202* (2013.01); *B41M 2205/14* (2013.01)
USPC ......................................................... 101/395

(58) Field of Classification Search
USPC ................. 101/395, 401.1; 430/270.1, 280.1, 430/286.1, 287.1
See application file for complete search history.

(56) References Cited

U.S. PATENT DOCUMENTS

| 5,719,009 | A | 2/1998 | Fan |
| 6,020,108 | A | 2/2000 | Goffing et al. |
| 7,205,092 | B2 * | 4/2007 | Ichikawa et al. ............ 430/273.1 |
| 2005/0202343 | A1 * | 9/2005 | Fujimaki .................... 430/270.1 |
| 2006/0008729 | A1 | 1/2006 | Ichikawa et al. |
| 2007/0117039 | A1 * | 5/2007 | Wada et al. ................. 430/270.1 |

FOREIGN PATENT DOCUMENTS

| DE | 41 17 127 | 11/1992 |
| JP | 62-124559 | 6/1987 |
| JP | 03-198058 | 8/1991 |
| JP | 08-305030 | 11/1996 |
| JP | 09-171247 | 6/1997 |
| JP | 10-509254 | 9/1998 |
| JP | 2004-163925 | 6/2004 |
| JP | 2006-003706 | 1/2006 |
| JP | 2006-276385 | 10/2006 |
| JP | 2007-114255 | 5/2007 |
| WO | 94/03838 | 2/1994 |
| WO | 2004/090638 | 10/2004 |

* cited by examiner

*Primary Examiner* — Joshua D Zimmerman
(74) *Attorney, Agent, or Firm* — Fish & Richardson P.C.

(57) ABSTRACT

The present invention aims to provide a flexographic printing original plate where, although it is a flexible aqueous developing plate, reproducibility of fine lines is good. A flexographic printing original plate which is a photosensitive printing original plate where at least (A) a supporting member, (B) a photosensitive resin layer, (C) a protective layer for preventing the polymerization inhibition due to oxygen in the photosensitive resin layer and (D) a heat-sensitive mask layer are successively layered, characterized in that, the photosensitive resin layer (B) is a layer which is able to be developed by water, Young's modulus of the protective layer (C) is 4 MPa to 35 MPa, layer thickness of the protective layer (C) is 0.2 μm to 2.0 μm and Young's modulus (MPa) and layer thickness (μm) of the protective layer (C) satisfy the following formula 1:

$1 \leq (\text{Young's modulus}) \times (\text{Layer thickness})^2 \leq 18$      (Formula 1).

14 Claims, No Drawings

FLEXOGRAPHIC PRINTING ORIGINAL PLATE

TECHNICAL FIELD OF THE INVENTION

The present invention relates to a flexographic printing original plate to be used for producing a flexographic printing plate according to a Computer to Plate Technique, and in particular, it concerns a flexographic printing original plate which is excellent in reproducibility of fine lines while being able to be developed by water.

BACKGROUND ART

In recent years, in the field of flexographic printing, a Computer to Plate Technique (CTP Technique), known as a digital image-forming technique, has been widely used as a general technique. The CTP technique is a method in which information processed on a computer is directly outputted onto a printing plate so that a concave/convex pattern to form a relief is obtained. This technique eliminates the necessity of negative film producing processes, thereby making it possible to reduce costs and time required for forming the negative film.

In the CTP technique, the negative film, conventionally used so as to cover areas that should not be polymerized, is replaced by a mask that is formed and integrated within a printing plate. As to a method for preparing this integrated mask, there has been proposed, for example, a method where an image mask is printed using an ink jet printer on a photosensitive plate (cf. Patent Document 1). According to this method however, there is a disadvantage that resolution is insufficient in a letterpress printing of high quality with medium tone.

Also, a method has been proposed where an infra-red ray sensitive layer that is opaque to chemical rays is formed on a photosensitive resin layer and by evaporating this infra-red ray sensitive layer by using an infrared laser, an image mask is formed (cf. Patent Document 2). This photosensitive printing original plate is constituted from photosensitive resin layer, barrier layer (protective layer) and infrared-sensitive layer and the barrier layer has a function of preventing the mass transfer between the photosensitive resin layer and the infrared-sensitive layer and of preventing the polymerization inhibition of the photosensitive resin layer due to oxygen in the air.

On the other hand, as to the photosensitive resin layer, that which is able to be developed by an aqueous type solution has been strongly demanded in view of affection to the environment and of workability. As to the flexographic photosensitive resin layer which is able to be developed by water, that comprising synthetic rubber and hydrophilic polymer has been put into the market (cf. Patent Document 3). Moreover, in recent years, there has been developed an aqueous developing plate where resolution is further enhanced by the use of latex which is present in fine grains as a main component (cf. Patent Document 4).

However, in the CTP plate using such a photosensitive resin layer which is able to be developed with water, the photosensitive resin is highly flexible and there is generated a problem caused thereby. To be more specific, there is a problem that wrinkles are formed on the whole plate and that reproducibility of fine lines is poor. They are generated when the plate is detached to return to the flat plane after the plate is attached to a drum in a laser processing. The above problem is particularly significant when a photosensitive resin layer comprising as a main component the latex is used. It is presumably because the latex is present in fine particles whereby the plate is more flexible.

As to a method for preventing the wrinkles on the plate, there has been proposed a constitution where a barrier layer (protective layer) on the photosensitive resin layer is omitted whereby the photosensitive resin layer directly contacts with the heat-sensitive mask layer (cf. Patent Document 5). However, when this method is applied to an aqueous developing plate comprising the latex as a main component, the polymerization inhibition of the photosensitive resin layer due to oxygen in the air is vigorous and satisfactory plate is never achieved. There has been also proposed a method where elastic modulus of the barrier layer (protective layer) on the photosensitive resin layer is made within a predetermined range (cf. Patent Document 6). In this method however, although it is effective for the wrinkles on the whole plate, no big improvement is achieved for reproducibility of fine lines. As such, it is the current status that no completely satisfactory plate has been achieved in an aqueous developing CTP plate or, particularly, an aqueous developing CTP comprising the latex as a main component.

Patent Document 1: German Patent No. 4117127
Patent Document 2: Japanese Patent Application Laid-Open (JP-A) No. 506201/95
Patent Document 3: Japanese Patent Application Laid-Open (JP-A) No. 198058/91
Patent Document 4: WO 2004/090638
Patent Document 5: Japanese Patent Application Laid-Open (JP-A) No. 305030/96
Patent Document 6: Japanese Patent Application Laid-Open (JP-A) No. 2006-3706

DISCLOSURE OF THE INVENTION

Problem that the Invention is to Solve

The present invention has been created in view of the current status of the prior art as such and its object is to provide a flexographic printing original plate where, although it is a flexible aqueous developing plate, reproducibility of fine lines is good.

Means for Solving the Problem

In order to achieve such an object, the present inventors have carried out extensive investigations and, as a result, they have round that the problem of poor reproducibility of fine lines in an aqueous developing plate is resulted by such a fact that, when the plate is attached to the drum and then detached to return to a flat plane, the heat-sensitive mask layer spread by attachment to the drum deforms the protective layer which is located below and the deformed protective layer sinks into the flexible photosensitive resin layer. As a result of further investigations, the present inventors have found that the above problem is able to be solved when Young's modulus and layer thickness of the protective layer are appropriately controlled so that the deformation of the photosensitive resin layer by the protective layer does not happen whereupon the present invention has been achieved.

Thus, in accordance with the present invention, there is provided a flexographic printing original plate which is a photosensitive printing original plate where at least (A) a supporting member, (B) a photosensitive resin layer, (C) a protective layer for preventing the polymerization inhibition due to oxygen in the photosensitive resin layer and (D) a heat-sensitive mask layer are successively layered, characterized in that, the photosensitive resin layer (B) is a layer which is able to be developed by water, Young's modulus of the protective layer (C) is 4 MPa to 35 MPa, layer thickness of the protective layer (C) is 0.2 μm to 2.0 μm and Young's modulus (MPa) and layer thickness (μm) of the protective layer (C) satisfy the following formula 1:

$$1 \le (\text{Young's modulus}) \times (\text{Layer thickness})^2 \le 18 \quad \text{(Formula 1)}.$$

According to the preferred embodiment of the present invention, the photosensitive resin layer (B) comprises the latex as a main component and the protective layer (C) is soluble in water.

Advantages of the Invention

In the flexographic printing original plate of the present invention, since Young's modulus and layer thickness of the protective layer are appropriately controlled so that deformation of the photosensitive resin layer by the protective layer does not happen, it is able to give a printing plate which is excellent in reproducibility of fine lines, resolution and printing property while being a flexible aqueous developing plate.

BEST MODE FOR CARRYING OUT THE INVENTION

The flexographic printing original plate of the present invention will now be illustrated in detail as follows.

The photosensitive flexographic printing original plate of the present invention has a constitution in which at least (A) a supporting member, (B) a photosensitive resin layer, (C) a protective layer and (D) a heat-sensitive mask layer are successively laminated.

The supporting member (A) to be used for the original plate of the present invention is flexible, and preferably made from a material having a superior dimension stability, and examples thereof include: a supporting member made of metal, such as steel, aluminum, copper and nickel, and a supporting member made of a thermoplastic resin, such as a polyethylene terephthalate film, a polyethylene naphthalate film, a polybutylene terephthalate film and a polycarbonate film. Among these, the polyethylene terephthalate film, which has a superior dimension stability and a sufficiently high viscoelasticity, is in particular preferably used. The thickness of the supporting member is set to 50 to 350 μm, preferably, to 100 to 250 μm, from the viewpoints of mechanical properties, shape stability and handling characteristics upon producing a printing plate. Moreover, if necessary, in order to improve an adhesive property between the supporting member and a photosensitive resin layer, an adhesive may be formed between them.

The photosensitive resin layer (B) to be used for the original plate of the present invention is composed of essential components, such as a synthetic polymer compound, a photopolymerizable unsaturated compound and a photopolymerization initiator, and desirable additives, such as a plasticizer, a thermal polymerization inhibitor, a dye, a pigment, an ultraviolet-ray absorbing agent, perfume, and an antioxidant. In the present invention, the photosensitive resin layer (B) must be the one which is developable by using a water-based developer. Latex is preferably used as the synthetic polymer compound that is able to be developed by water. Although the photosensitive resin layer which is able to be developed by water is usually flexible, the crude plate inevitably becomes very flexible when latex is used. When latex is not used, the thing which is mentioned, for example, in Japanese Laid-Open Patent No. 198058/91 may be used.

Examples of the latex that are applicable include: water dispersible latex polymers, such as polybutadiene latex, natural rubber latex, styrene-butadiene copolymer latex, acrylonitrile-butadiene copolymer latex, polychloroprene latex, polyisoprene latex, polyurethane latex, methylmethacrylate-butadiene copolymer latex, vinylpyridine polymer latex, butyl polymer latex, thiokol polymer latex and acrylate polymer latex, and polymers obtained by copolymerizing another component, such as acrylic acid and methacrylic acid, therewith. Among these, water dispersible latex polymers having a butadiene skeleton or an isoprene skeleton in molecular chains are preferably used from the viewpoints of hardness and rubber elasticity. More specifically, polybutadiene latex, styrene-butadiene copolymer latex, acrylonitrile-butadiene copolymer latex, methylmethacrylate-butadiene copolymer latex and polyisoprene latex are preferably used. The latex needs to be designed so that its existence is confirmed as independent fine particles.

The protective layer (C) used for the original plate of the present invention is installed for preventing the polymerization inhibition of the photosensitive resin layer due to oxygen. There is no particular limitation for the protective layer (C) so far as it is able to be removed by a water-based developer and it may be constituted using any of water-soluble and insoluble polymers. Even when the polymer is insoluble in water, it is removed by physically rubbing with a brush whereby the development is possible but, for shortening the developing time, it is preferred to use a water-soluble polymer. Examples of such polymers forming the protective layer (C) include water soluble polyamide, polyvinyl alcohol, polyacrylic acid, polyethylene oxide, alkyl cellulose, cellulose-based polymer (in particular, hydroxypropyl cellulose, hydroxyethyl cellulose and nitrocellulose), cellulose acetate butyrate, polybutyral, butyl rubber, NBR rubber, acrylic rubber, styrene-butadiene rubber, latex and soluble polyesters. Not particularly limited to one kind, two or more kinds of these polymers may be combined with one another and used. Those protective layers (C) having a thermal decomposing temperature that is higher than that of the heat-sensitive mask layer are preferably used. When the thermal decomposing temperature of the protective layer is lower than that of the heat-sensitive mask layer, upon abrasion of the heat-sensitive mask layer, the protective layer might also be thermally decomposed.

In the present invention, it is necessary that Young's modulus (MPa) and layer thickness (μm) of the protective layer (C) satisfy the following formula 1:

$$1 \le (\text{Young's modulus}) \times (\text{Layer thickness})^2 \le 18 \quad \text{(Formula 1)}.$$

When (Young's modulus)×(Layer thickness)² is more than the upper limit of the above range, wrinkles are resulted on the whole plate surface and poor reproducibility of fine lines happens while, when (Young's modulus)×(Layer thickness)² is less than the lower limit, printing property of the plate is poor and that is not preferred. Preferably, Young's modulus (MPa) and layer thickness (μm) of the protective layer (C) satisfy the following formula 2 and, more preferably, they satisfy the following formula 3:

$$1.5 \le (\text{Young's modulus}) \times (\text{Layer thickness})^2 \le 16.5 \quad \text{(Formula 2)}$$

$$2.0 \le (\text{Young's modulus}) \times (\text{Layer thickness})^2 \le 15 \quad \text{(Formula 3)}.$$

When the present inventors have investigated the reasons for poor reproducibility of fine lines on the printing original plate where the conventional photosensitive resin layer which is able to be developed by water is used, they have found that it happens when the original plate is returned to the flat plane after attaching the original plate to the drum. To be more specific, it has been found that the heat-sensitive mask layer which has been spread by winding to the drum does not immediately return to the original length from the spread state upon returning to the flat plane whereby the spread area loses the place to go and, on the fine line area, the adjacent protective layer located thereunder receives the force of being pushed from both sides into inside by the spread heat-sensitive mask layer whereby the protective layer sinks into (or deforms) the photosensitive resin layer resulting in the poor reproducibility of fine lines. As a countermeasure therefor, it has been found to be necessary that the protective layer (C) has such rigidity and flexibility that it has no force of deforming the photosensitive resin layer (B) and the condition therefor is stipulated by the above formula 1. The reason why the degree of contribution of layer thickness is higher than that of Young's modulus in the above formula 1 is that the rigidity of the protective layer usually becomes big in accordance with the cube of the layer thickness.

Examples of the method for adjusting (lowering) the Young's modulus of the protective layer (C) so as to satisfy the above formula 1 are that where the polymer having low degree of saponification or the polymer having low glass transition temperature is used as a polymer which constitutes the protective layer, that where latex is used and that where large amount of plasticizer having a good compatibility with the using polymer is used. When latex is used as the polymer which constitutes the protective layer, there is achieved an additional effect that the protective layer is hardly subjected to thermal decomposition when the printing original plate is irradiated with IR. An example of a method for controlling the layer thickness of the protective layer (C) so as to satisfy the above formula 1 is that where the type of a bar coater used for application or the solid concentration upon application is adjusted.

In the present invention, it is necessary that Young's modulus of the protective layer (C) is 4 MPa to 35 MPa. When Young's modulus of the protective layer is outside the above range, there may be the case where it is difficult to satisfy the formula 1.

In the present invention, it is necessary that layer thickness of the protective layer (C) is 0.2 µm to 2.0 µm. When layer thickness of the protective layer is outside the above range, there may be the case where it is difficult to satisfy the formula 1.

The heat-sensitive mask layer (D) to be used for the original plate of the present invention is composed of a binder and a material having a function for absorbing infrared rays to convert them into heat and a function for blocking ultraviolet rays. Moreover, desired components except for these, such as a pigment dispersant, a filler, a detergent or a painting aid, may be contained therein within such a range as not to impair the effects of the present invention.

The heat-sensitive mask layer (D) is preferably designed to have an optical density of 2.0 or more, more preferably, an optical density of 2.0 to 3.0, and most preferably, an optical density of 2.2 to 2.5, relative to chemical rays.

The layer thickness of the heat-sensitive layer (D) is preferably set to 0.5 to 5.0 µm, more preferably, to 1.0 to 2.0 µm. When the layer thickness is set to the above-mentioned lower limit or more, it is possible to obtain an optical density of not less than a predetermined value, without the necessity of a high coating technique. Moreover, when the layer thickness is set to the above-mentioned upper limit or less, high energy is not required for evaporation of the heat-sensitive mask layer, thereby making it possible to provide an advantageous method from the viewpoint of costs.

Although there is no particular limitation for the above binder, a copolymerized polyamide having polarity is preferably used. The polyamide used may be appropriately selected from the conventionally known cationic polyamide, nonionic polyamide and anionic polyamide and examples thereof include polyamide which contains tertiary amine group, polyamide which contains quaternary ammonium salt group, polyamide which contains ether group and polyamide which contains sulfonic group.

Examples of the above material having an infrared ray absorbing function and an ultraviolet ray blocking function include dyes such as phthalocyanine, substituted phthalocyanine derivative, cyanine, merocyanine dye or polymethine dye and pigments such as carbon black, graphite, chromium oxide or iron oxide. Among them, carbon black is particularly preferred in view of light-heat converting rate, economy and handling property.

The above material having an infrared ray absorbing function and an ultraviolet ray blocking function is used appropriately in a concentration of being able to achieve the above optical concentration and layer thickness and, usually, it is 1 to 60% by weight or, preferably, 10 to 50% by weight to the total weight of the heat-sensitive mask layer (D). When the amount is less than the lower limit, the optical concentration becomes less than 2.0 and there is a risk that neither infrared ray absorbing function nor ultraviolet ray blocking function is available. When the amount is more than the above upper limit, other component such as a binder becomes insufficient and there is a risk that the coat-forming property lowers.

It is preferable to install a peelable flexible cover film on the heat-sensitive mask layer (D) to protect the printing original plate. Examples of the preferable peelable flexible cover film include a polyethylene terephthalate film, a polyethylene naphthalate film and a polybutylene terephthalate film. However, such a protective film is not absolutely necessary.

Although the method for manufacturing a flexographic printing original plate of the present invention is not particularly limited, it is generally manufactured by using the following processes:

First, all the components of the heat-sensitive mask layer are dissolved in an appropriate solvent to prepare a solution, or all the components except for pigments are dissolved in an appropriate solvent when pigments like carbon black is used, and pigments are dispersed therein to prepare a dispersion solution. Next, this solution or dispersion solution is applied to a supporting member (for example, a PET film) for a heat-sensitive mask layer, and the solvent is evaporated. Thereafter, protective layer components are applied thereon so that one of laminated bodies is formed. In the meantime, in a separated manner from this, a photosensitive resin layer is formed on a supporting member by a coating process so that the other laminated body is prepared. The two laminated bodies, thus obtained, are laminated under pressure and/or a heating process so that the photosensitive resin layer is arranged adjacent to the protective layer. Here, the supporting member for the heat-sensitive mask layer functions as a surface protective film after completion of the printing original plate.

When the protective film is present, a method for manufacturing a printing plate from the printing original plate of the present invention includes processes in which, first, the protective film is removed from the photosensitive printing original plate. Thereafter, the heat-sensitive mask layer is imagewise-irradiated with an IR laser so that a mask is formed on the photosensitive resin layer. Preferable examples of the IR laser include an ND/YAG laser (1064 nm) and a diode laser (for example, 830 nm). A laser system appropriate for the Computer to Plate Technique is commercially available, and, for example, a diode laser system CDI Spark (manufactured by Esko-Graphics Co., Ltd.) may be used. This laser system includes a rotation cylinder drum used for holding a printing original plate, an IR laser irradiating device and a layout computer, and image information is directly transferred from the layout computer to the laser device.

After the image information has been written in the heat-sensitive mask layer, active light rays are applied onto the entire surface of the photosensitive printing original plate through the mask. This process may be carried out with the plate attached to the laser cylinder; however, a method is generally used in which, after the plate has been removed from the laser device, the irradiation process is carried out by using a commonly-used irradiation unit having a flat plate shape because this method is more advantageous in that even a plate size out of the standard can be appropriately handled. Examples of the active light rays include: ultraviolet rays having a wavelength in a range from 150 to 500 nm, in particular, from 300 to 400 nm. Examples of its light source include: a low-pressure mercury lamp, a high-pressure mercury lamp, a super-high pressure mercury lamp, a metal halide lamp, a xenon lamp, a zirconium lamp, a carbon arc lamp and an ultraviolet-ray fluorescent lamp. Thereafter, the irradiated plate is developed so that a printing plate is obtained. The developing process can be carried out by using a commonly-used developing unit.

EXAMPLES

The present invention will now be specifically illustrated by way of the following Examples although the present invention is not limited thereto. Methods for the measurement of Young's modulus, layer thickness and stuffing displacement value will be shown below.

Measurement of Young's Modulus:

The composition constituting the protective layer was dissolved in a solvent which is able to dissolve the composition among water, a mixed solution of water with isopropyl alcohol and an organic solvent, coated on polyethylene terephthalate and dried at 120° C. for five minutes and the coated film was peeled off. Solid concentration and a bar coater were adjusted so as to make the thickness of the coated film 2 μm. Stripes of 10 mm width were cut out from this sheet using a blade of microtome to prepare a test piece. This test piece was subjected to a tensile breakage test using a Tensilon universal tester 1210A manufactured by Orientec under the condition where crosshead speed was 200 mm/minute, distance between the chucks was 20 mm and chart speed was 200 mm/minute. Young's modulus was calculated from the stress when elongated to an extent of 2% on the recorded chart paper.

Measurement of the Layer Thickness:

A protective layer solution was applied using a bar coater on a PET film subjected to a releasing treatment and dried at 120° C. for five minutes to form a protective layer. The resulting protective layer was cut out into 10 cm×10 cm, the PET film was released therefrom and weight of the protective layer was measured by using precision scales to calculate the layer thickness of the protective layer.

Measurement of the Stuffing Displacement Value:

A disk-shaped pressure element of 10 mm diameter was loaded for 60 seconds with a load of 120 g weight on a printing original plate where a photosensitive resin layer of 1.70 mm thickness was aligned on a supporting member and the displacement at that time was measured using a Linear Sensor (GS-112) manufactured by Ono Sokki. The more the stuffing displacement value, the more flexible the plate.

Preparation of Photosensitive Resin Compositions a to C

Photosensitive Resin Composition a (Photosensitive Resin Composition which is Able to be Developed by Water):

Acrylonitrile-butadiene latex (Nipol SX1503 containing 42% of non-volatile components; manufactured by Nippon Zeon) (10 parts by weight), 58 parts by weight of butadiene latex (Nipol LX111NF containing 55% of non-volatile components; manufactured by Nippon Zeon), 28 parts by weight of oligobutadiene acrylate (ABU-2S manufactured by Kyoeisha Kagaku), 4 parts by weight of lauryl methacrylate (Light Ester L manufactured by Kyoeisha Kagaku), 4 parts by weight of dimethylol tricyclodecane diacrylate, 1 part by weight of photopolymerization initiator, 0.1 part by weight of hydroquinone monomethyl ether (as a polymerization inhibitor) and 0.1 part by weight of nonionic surfactant (as other additive) were mixed in a container together with 15 parts by weight of toluene and kneaded at 105° C. using a pressurizing kneader and, after that, toluene and water were removed therefrom in vacuo to give a photosensitive resin composition A. The stuffing displacement value of this composition A was measured and found to be 15 μm.

Photosensitive Resin Composition B (Photosensitive Resin Composition which is Able to be Developed by Water):

A solution where 21.8 parts by weight of hexamethylene diisocyanate, 15.4 parts by weight of dimethylol propionate, 7.6 parts by weight of polytetramethylene glycol (PG-100 manufactured by Nippon Polyurethane Industry) and 1.0 part by weight of di-n-butyl tin dilaurate were dissolved in 300 parts by weight of tetrahydrofuran was placed in a one-liter flask equipped with a stirrer and the flask was heated at 65° C. with stirring to continue the reaction for three hours. A solution prepared in another container by dissolving 55.3 parts by weight of terminal amino group-containing acrylonitrile-butadiene oligomer (Hycar ATBNB. X 1300×16 manufactured by UBE INDUSTRIES, LTD.) in 100 parts by weight of methyl ethyl ketone was added into the above one-liter flask at room temperature with stirring. The resulting polymer solution was dried in vacuo to remove tetrahydrofuran and methyl ethyl ketone therefrom to give a polymer where a number-average molecular weight was 21,000. After that, a solution prepared by dissolving 4.8 parts by weight of lithium hydroxide in 100 parts by weight of methyl alcohol was added to a solution which was prepared by dissolving 100 parts by weight of the above-prepared polymer in 100 parts by weight of methyl ethyl ketone, at room temperature with stirring followed by stirring for 30 minutes more to give a hydrophilic polymer [I].

This hydrophilic polymer [I] (10 parts by weight), 45 parts by weight of chlorinated polyethylene (H-135 manufactured by Osaka Soda) and 15 parts by weight of styrene-butadiene rubber (SBR 1507 manufactured by Nippon Synthetic Rubber) as hydrophobic polymers, 28.5 parts by weight of butadiene oligoacrylate (PB-A manufactured by Kyoeisha Yushi) as an ethylenic unsaturated group-containing compound, 1 part by weight of benzyl dimethyl ketanol (Irgacure 651 manufactured by Ciba-Geigy) as a photopolymerization initiator and 0.5 parts by weight of hydroquinone monomethyl ether as a polymerization inhibitor were dissolved and dispersed in 40 parts by weight of toluene and 10 parts by weight of water and kneaded at 105° C. using a pressurizing kneader and, after that, toluene and water were removed therefrom in vacuo to give a photosensitive resin composition B. The stuffing displacement value of this composition B was measured and found to be 10 μm.

Photosensitive Resin Composition C (Photosensitive Resin Composition which is Able to be Developed by Solvent):

Tufprene A (styrene-butadiene-styrene block copolymer manufactured by Asahi Kasei) (60 parts by weight), 30 parts by weight of B-2000 (liquid polybutadiene manufactured by Nippon Petrochemical), 7 parts by weight of 1,9-nonandiol diacrylate, 2 parts by weight of 2,2-dimethoxy-2-phenylacetophenone and 0.3 part by weight of 2,6-di-tert-butyl-p-cresol were kneaded using a kneader to give a photosensitive resin composition C. The stuffing displacement value of this composition C was measured and found to be 3 μm.

Preparation of Compositions I to IV for Protective Layer

Composition I for Protective Layer:

Polyvinyl alcohol of low degree of saponification (KH20 manufactured by Nippon Gosei), plasticizer (Sanflex SE 270 manufactured by Sanyo Chemical Industries; polyether polyol of an aliphatic polyhydric alcohol type; solid concentration 85%) and NBR latex (SX1503A manufactured by Nippon Zeon; solid concentration 42%) were mixed in a ratio by weight of 50/20/30 to give a composition I for protective layer. Young's modulus of this composition I was measured and found to be 10 MPa.

Composition II for Protective Layer:

Polyvinyl alcohol of low degree of saponification (KH20 manufactured by Nippon Gosei), plasticizer (Sanflex SE 270 manufactured by Sanyo Chemical Industries; polyether polyol of an aliphatic polyhydric alcohol type; solid concentration 85%) and NBR latex (SX1503A manufactured by Nippon Zeon; solid concentration 42%) were mixed in a ratio by weight of 50/40/10 to give a composition II for protective layer. Young's modulus of this composition II was measured and found to be 5 MPa.

Composition III for Protective Layer:

Polyvinyl alcohol of low degree of saponification (KH20 manufactured by Nippon Gosei) and plasticizer (Sanflex SE 270 manufactured by Sanyo Chemical Industries; polyether polyol of an aliphatic polyhydric alcohol type; solid concentration 85%) were mixed in a ratio by weight of 65/35 to give a composition III for protective layer. Young's modulus of this composition III was measured and found to be 30 MPa.

Composition IV for Protective Layer:

Copolymerized polyester (Vylon 300 manufactured by Toyobo; grass transition temperature: 6° C.) and copolymerized polyester (Vylon 200 manufactured by Toyobo; grass transition temperature: 67° C.) were mixed in a ratio by weight of 80/20 to give a composition IV for protective layer. Young's modulus of this composition IV was measured and found to be 20 MPa.

Composition V for Protective Layer:

Polyvinyl alcohol of high degree of saponification (AH26 manufactured by Nippon Gosei) and plasticizer (Sanflex SE 270 manufactured by Sanyo Chemical Industries; polyether polyol of an aliphatic polyhydric alcohol type; solid concentration 85%) were mixed in a ratio by weight of 80/20 to give a composition V for protective layer. Young's modulus of this composition V was measured and found to be 100 MPa.

Preparation of Applying Solution for Heat-sensitive Mask Layer

As an applying solution for heat-sensitive mask layer, a mixture of carbon black dispersion (manufactured by Orient Kogyo; AMBK-8) and copolymerized polyamide was used. Mixing ratio of the components in the mixture in a weight ratio in terms of solid is (carbon black):(dispersed rein):(copolymerized polyamide)=35:28:37.

Preparation of Heat-sensitive Mask Film

Both sides of a PET film (E5000 manufactured by Toyobo; thickness: 100 μm) were subjected to a releasing treatment and an applying solution for heat-sensitive mask layer was applied thereon using a bar coater #12 and dried at 120° C. for five minutes. The optical concentration at that time was 2.3. This optical concentration was measured by a white-and-black transmission densitometer DM-520 (manufactured by Dainippon Screen). After that, the above composition for protective layer was applied thereon using a bar coater of a suitable type for giving the predetermined thickness and dried at 120° C. for five minutes.

Flexographic Original Plate

The above photosensitive resin composition was aligned on a PET film supporting member (E5000 manufactured by Toyobo; thickness: 125 μm) on which an adhesive of a copolymerized polyester type was applied and a heat-sensitive mask film was layered thereon. The above was laminated at 100° C. using a heat press machine to give a flexographic original plate comprising PET supporting member, adhesive layer, photosensitive resin layer, protective layer, heat-sensitive mask layer and PET protective film subjected to a releasing treatment (cover film). Total thickness of the plate was 1.90 mm.

Manufacture of Printing Plate from Flexographic Original Plate

Chemical ray (light source: Philips 10R; illumination at 365 nm: 8 mW/cm$^2$) was irradiated for one minute from the PET supporting member side of the original plate. After that, the PET film (cover film) subjected to a releasing treatment was peeled off therefrom. This plate was wound around a rotary drum of Digital Imager Spark (manufactured by Valco) in such a manner that the heat-sensitive mask layer came on the surface side and evacuated followed by forming an image. After ablation, the plate was taken out and returned to a flat plane and chemical ray (light source: Philips 10R; illumination at 365 nm: 8 mW/cm$^2$) was irradiated thereon for six minutes. After that, development was carried out at 40° C. for eight minutes using a developing device (Stuck System) manufactured by A&V. Tap water to which 1% of Cascade (detergent for tableware manufactured by P&G, U.S.A.) was added was used as a developer. After developing, it was dried at 60° C. for ten minutes, chemical ray was irradiated thereon for ten minutes and, finally, a germicidal lamp was irradiated thereon for five minutes for removing the stickiness on the surface.

Performance Evaluations

Performances of each of the printing plates thus obtained were evaluated in the following manner.

Wrinkles on whole plate: Wrinkles were evaluated by naked eye.

o: no wrinkle x: with wrinkle

Reproducibility of fine lines: Fine lines with 50-μ width (fine lines perpendicular to a stretching direction) were evaluated under a microscope of 100 magnifications.

o: surface of fine lines was flat and smooth

Δ: surface of fine lines was almost flat and smooth (Scars where the protective layer somewhat sank into the photosensitive resin layer were noted.)

x: surface of fine lines was not flat and smooth (Scars where the protective layer largely sank into the photosensitive resin layer were noted.)

Resolution: Printing was conducted using a relief after plate-making and the printed letters of one-point type were evaluated under a microscope of 100 magnifications.

o: letters were clear

Δ: letters were a bit fat x: illegible

Printing property: Printing was conducted using a relief after plate-making and the ink transfer on the solid printing was evaluated.

o: ink transfer was very good

Δ: ink transfer was good x: ink transfer was poor

Aqueous developing ability: State of the relief after developing was confirmed by naked eye.

o: developing was well done within short time

Δ: time-consuming for good developing x: poor developing

Tables 1 and 2 show the results of these performance evaluations.

only in the case where the relation between Young's modulus and layer thickness satisfied the formula 1 (Examples 1-10), good results were achieved in all terms of wrinkles on the whole plate, reproducibility of fine lines, resolution and printing property. In Comparative Example 6 where no protective layer was installed, polymerization inhibition of the photosensitive resin layer due to oxygen in the air was severe whereby printing property and resolution were poor.

It is understood from the above result that, in a flexible flexographic original plate where an aqueous developing is possible, the relation between Young's modulus and layer thickness is very important and, only when the relation satisfies the formula 1, it is possible to prepare a printing plate where no wrinkle is not on the whole plate and reproducibility of fine lines, resolution and printing property are excellent.

Industrial Applicability

TABLE 1

Evaluation Results of Printing Plates of Examples 1-10

| | Examples | | | | | | | | | |
|---|---|---|---|---|---|---|---|---|---|---|
| | 1 | 2 | 3 | 4 | 5 | 6 | 7 | 8 | 9 | 10 |
| Photosensitive resin composition | A | A | A | A | A | A | B | A | A | A |
| Composition for protective layer | I | I | I | II | III | III | I | IV | II | II |
| Young's modulus of the protective layer (Mpa) | 10 | 10 | 10 | 5 | 30 | 30 | 10 | 20 | 5 | 5 |
| Layer thickness of the protective layer (μm) | 1 | 0.5 | 0.4 | 1 | 0.7 | 0.3 | 1 | 0.7 | 1.5 | 1.8 |
| Formula 1 ((Young's modulus) × (Layer thickness)$^2$) | 10.0 | 2.5 | 1.6 | 5.0 | 14.7 | 2.7 | 10.0 | 9.8 | 11.3 | 16.2 |
| Evaluation results  Wrinkles on whole plate | o | o | o | o | o | o | o | o | o | o |
| Reproducibility of fine lines | o | o | o | o | Δ | o | o | o | o | Δ |
| Resolution | o | o | o | o | o | o | Δ | o | o | o |
| Printing property | o | o | Δ | o | o | o | o | o | o | o |
| Aqueous developing ability | o | o | o | o | o | o | o | Δ | o | o |

TABLE 2

Evaluation Results of Printing Plates of Comparative Examples 1-8

| | Comparative examples | | | | | | | |
|---|---|---|---|---|---|---|---|---|
| | 1 | 2 | 3 | 4 | 5 | 6 | 7 | 8 |
| Photosensitive resin composition | A | A | A | A | A | A | C | C |
| Composition for protective layer | I | I | II | III | V | None | I | III |
| Young's modulus of the protective layer (Mpa) | 10 | 10 | 5 | 30 | 100 | — | 10 | 30 |
| Layer thickness of the protective layer (μm) | 1.5 | 0.2 | 2 | 1 | 0.6 | — | 0.8 | 1 |
| Formula 1 ((Young's modulus) × (Layer thickness)$^2$) | 22.5 | 0.4 | 20.0 | 30.0 | 36.0 | — | 6.4 | 30.0 |
| Evaluation Results  Wrinkles on whole plate | o | o | o | o | x | o | o | o |
| Reproducibility of fine lines | x | o | x | x | x | o | o | o |
| Resolution | o | o | o | o | o | x | o | o |
| Printing property | o | x | o | o | x | x | o | o |
| Aqueous developing ability | o | o | o | o | o | o | x | x |

As will be apparent from Tables 1 and 2, the photosensitive resin layer was hard (the stuffing displacement value: 3 μm) in the original plate of Comparative Examples 7 and 8 which were developable by solvent and, therefore, no sinking of the protective layer into the photosensitive resin layer was noted and wrinkles on the whole plate, reproducibility of fine lines, resolution and printing property were good but the plate was not developable by water. On the contrary, in the original plates of Examples 1 to 10 and Comparative Examples 1 to 6 which were developable by water, reproducibility of fine lines was inferior particularly in Comparative Examples 1, 3, 4 and 5 where the relation between Young's modulus and layer thickness was bigger than the upper limit of the formula 1 while, in Comparative Example 2 where the relation between Young's modulus and layer thickness was smaller than the lower limit of the formula 1, printing property was poor and, In spite of the fact that the flexographic original plate of the present invention is flexible and is able to be developed by water, said plate has no problem of poor reproducibility of fine lines at all whereby it is quite useful especially as a CTP plate which is photoengraved by means of a computer plate-making art.

The invention claimed is:

1. A flexographic printing original plate which is a photosensitive printing original plate where at least (A) a supporting member, (B) a photosensitive resin layer, (C) a protective layer for preventing the polymerization inhibition due to oxygen in the photosensitive resin layer and (D) a heat-sensitive mask layer are layered in the following order: (A), (B), (C), and (D), wherein the photosensitive resin layer (B) is a layer which is able to be developed by a water-based developer, Young's modulus of the protective layer (C) is 4 MPa to 35 MPa, layer thickness of the protective layer (C) is 0.2 μm to 2.0 μm and Young's modulus (MPa) and layer thickness (μm) of the protective layer (C) satisfy the following Formula 1:1 MPa(μm)² ≤ (Young's modulus)× (Layer thickness)² ≤ 18 MPa(μm)² (Formula 1), and the heat-sensitive mask layer (D) comprises a binder and a material capable of absorbing infrared rays and blocking ultraviolet rays.

2. The flexographic printing original plate according to claim 1, wherein the photosensitive resin layer (B) comprises the latex as a main component.

3. The flexographic printing original plate according to claim 1 or 2, wherein the protective layer (C) is soluble in water.

4. The flexographic printing original plate of claim 1, wherein the binder comprises a polyamide.

5. The flexographic printing original plate of claim 4, wherein the binder comprises a polyamide copolymer.

6. The flexographic printing original plate of claim 4, wherein the binder comprises a cationic polyamide, an anionic polyamide, or a nonionic polyamide.

7. The flexographic printing original plate of claim 4, wherein the polyamide comprises a tertiary amine group, a quaternary ammonium salt group, an ether group, or a sulfonic group.

8. The flexographic printing original plate of claim 1, wherein the material comprises a dye or a pigment.

9. The flexographic printing original plate of claim 8, wherein the pigment comprises carbon black, graphite, chromium oxide, or iron oxide.

10. The flexographic printing original plate of claim 1, wherein the protective layer (C) comprises a water-soluble polymer.

11. The flexographic printing original plate of claim 10, wherein the water-soluble polymer comprises a polyamide, a polyvinyl alcohol, a polyacrylic acid, a polyethylene oxide, an alkyl cellulose, a cellulose-based polymer, a cellulose acetate butyrate, a polybutyral, butyl rubber, a NBR rubber, an acrylic rubber, a styrene-butadiene rubber, a latex, a polyester, or a mixture thereof.

12. The flexographic printing original plate of claim 1, wherein the protective layer (C) has a thermal decomposing temperature higher than that of the heat-sensitive mask layer (D).

13. The flexographic printing original plate of claim 2, wherein the latex comprises a polybutadiene latex, a natural rubber latex, a styrene-butadiene copolymer latex, an acrylonitrile-butadiene latex, a polychloroprene latex, a polyisoprene latex, a polyurethane latex, a methylmethacrylate-butadiene copolymer latex, a vinylpyridine polymer latex, a butyl polymer latex, a thiokol polymer latex, an acrylate polymer latex, or a copolymer comprising acrylic acid or methacrylic acid.

14. The flexographic printing original plate of claim 2, wherein the latex comprises a polybutadiene latex, a styrene-butadiene copolymer latex, an acrylonitrile-butadiene latex, a polyisoprene latex, or a methylmethacrylate-butadiene copolymer latex.

* * * * *